(12) United States Patent
Park

(10) Patent No.: US 8,035,180 B2
(45) Date of Patent: Oct. 11, 2011

(54) IMAGE SENSOR AND METHOD FOR MANUFACTURING THE SAME

(75) Inventor: Seung Ryong Park, Seochu-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 323 days.

(21) Appl. No.: 12/209,341

(22) Filed: Sep. 12, 2008

(65) Prior Publication Data

US 2009/0108386 A1    Apr. 30, 2009

(30) Foreign Application Priority Data

Oct. 31, 2007  (KR) .................. 10-2007-0110051

(51) Int. Cl.
*H01L 31/0216* (2006.01)
*H01L 21/00* (2006.01)

(52) U.S. Cl. ............ 257/436; 257/59; 257/72; 257/291; 257/294; 257/448; 257/E31.121; 257/E31.122; 257/E21.532; 438/69; 438/87

(58) Field of Classification Search ............ 257/59, 257/72, 291, 294, 436, 448, E31.121, E31.122, 257/E21.532; 438/69, 83
See application file for complete search history.

(56) References Cited

U.S. PATENT DOCUMENTS

| 7,041,956 | B2* | 5/2006 | Takahashi et al. | 250/208.1 |
| 7,442,973 | B2* | 10/2008 | Komoguchi et al. | 257/291 |
| 7,524,690 | B2* | 4/2009 | Ko et al. | 438/31 |
| 7,554,143 | B2* | 6/2009 | Lim | 257/294 |
| 7,592,645 | B2* | 9/2009 | Hashimoto | 257/184 |
| 7,663,160 | B2* | 2/2010 | Fellous et al. | 257/184 |
| 7,884,438 | B2* | 2/2011 | Partain et al. | 257/443 |
| 2005/0236553 | A1* | 10/2005 | Noto et al. | 250/208.1 |
| 2008/0191296 | A1* | 8/2008 | Wang et al. | 257/432 |
| 2008/0251697 | A1* | 10/2008 | Park et al. | 250/208.1 |

FOREIGN PATENT DOCUMENTS

| JP | 2006-332347 | 12/2006 |
| KR | 10-2006-0077075 | 7/2006 |

* cited by examiner

*Primary Examiner* — Victor A Mandala
(74) *Attorney, Agent, or Firm* — Saliwanchik, Lloyd & Eisenschenk

(57) ABSTRACT

Provided is an image sensor and method for manufacturing the same. The image sensor includes a semiconductor substrate including a photodiode for each unit pixel, an interlayer insulating layer including metal lines on the semiconductor substrate, and an optical refractive part in a region of the interlayer insulating layer corresponding to the photodiode for focusing light on the photodiode. The optical refractive part can be formed by implanting impurities into the interlayer insulating layer.

17 Claims, 3 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0110051, filed Oct. 31, 2007, which is hereby incorporated by reference in its entirety.

BACKGROUND

An image sensor is a semiconductor device that converts an optical image to an electrical signal. Image sensors are generally classified as a charge coupled device (CCD) or a complementary metal oxide semiconductor (CMOS) image sensor (CIS).

The CIS includes a photodiode and a MOS transistor in a unit pixel. The CIS sequentially detects electric signals of unit pixels in a switching manner to realize an image.

As the design rule in the CIS decreases gradually, the size of a unit pixel also decreases, which may cause the photosensitivity to be decreased. To increase the photosensitivity, a microlens is often formed on a color filter.

However, an additional structure, such as a metal line or the like, existing on a light path from the microlens to a photodiode, may cause light diffraction, light scattering, or the like, thereby decreasing the photosensitivity of the image sensor.

BRIEF SUMMARY

Embodiments provide an image sensor and a method for manufacturing the same that can improve the photosensitivity of a photodiode.

In an embodiment, an image sensor can include: a semiconductor substrate including a photodiode for each unit pixel; an interlayer insulating layer including a metal line on the semiconductor substrate; and an optical refractive part disposed within the interlayer insulating layer in a region corresponding to the photodiode for focusing light on the photodiode.

In another embodiment, a method for manufacturing an image sensor can include: forming a photodiode for each unit pixel on a semiconductor substrate; forming an interlayer insulating layer on the semiconductor substrate; and forming an optical refractive part in a region of the interlayer insulating layer corresponding to the photodiode in order to focus light on the photodiode.

The details of one or more embodiments are set forth in the accompanying drawings and the description below. Other features will be apparent from the description and drawings, and from the claims.

DETAILED DESCRIPTION

Figure 1:
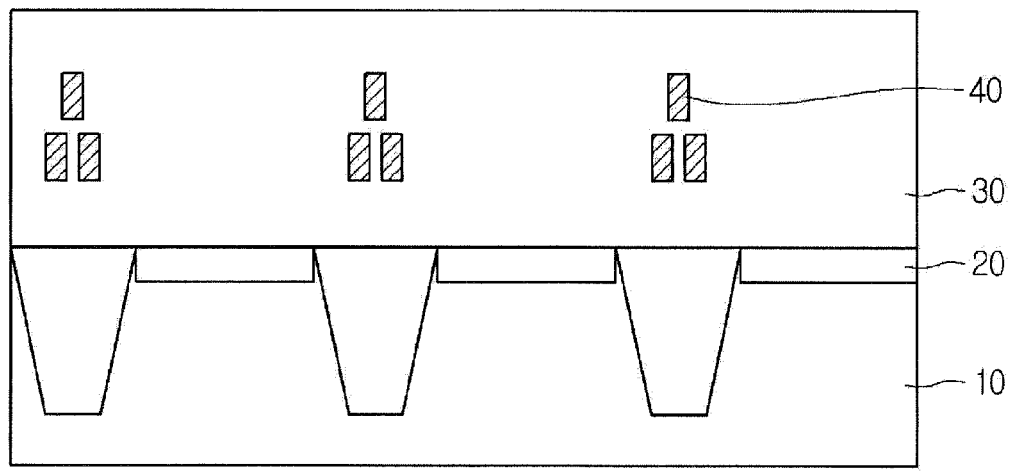
FIGS. 1 through 5 are cross-sectional views illustrating a process for manufacturing an image sensor according to an embodiment.

Embodiments of an image sensor and a manufacturing method thereof will be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

In the drawings, the thickness or size of each layer may be exaggerated, omitted, or schematically illustrated for convenience in description and clarity. Also, the size of each element does not entirely reflect an actual size.

According to an embodiment, an image sensor can include unit pixels, each unit pixel having a photodiode and at least one transistor. For example, referring to FIG. 4, a photodiode 20 receiving light to generate photo charges is disposed in each unit pixel on a semiconductor substrate 10.

Although not shown in the drawing, a CMOS circuit (not shown) connected to the photodiode 20 to convert the received photons to an electrical signal can be formed in each unit pixel.

An interlayer insulating layer 30 including metal lines 40 is disposed on the semiconductor substrate 10 to provide signal and power connections for the circuits.

The interlayer insulating layer 30 can be formed of at least two layers. For example, the interlayer insulating layer 30 can include a nitride layer and an oxide layer.

The metal line 40 penetrates the interlayer insulating layer 30 and is formed in plurality. A layout of the metal line 40 can be designed such that the metal line 40 does not block light that is incident into the photodiode 20.

An optical refractive part 50 is disposed within the interlayer insulating layer 30 in a region corresponding to the photodiode 20. The optical refractive part 50 focuses light on the photodiode 20 and can act as a microlens. Accordingly, the optical refractive part 50 can be disposed within the interlayer insulating layer 30 between the metal lines 40 to focus light on the photodiode 20.

The optical refractive part 50 can be formed of an impurity having a higher refractive index than the interlayer insulating layer 30. That is according to an embodiment, the interlayer insulating layer 30 can have a refractive index ranging from 1.4 to 1.5, and the optical refractive part 50 can have a refractive index ranging from 1.6 to 1.7.

Therefore, the optical refractive part 50 can be formed with a higher refractive index than the interlayer insulating layer 30 to converge, diverge and align light. For example, in one embodiment, the optical refractive part 50 can include silver ions. In another embodiment, the optical refractive part 50 can include, for example, lithium ions.

The optical refractive part 50 can be formed of an impurity having a graded index along a light path to the photodiode 20. That is, the optical refractive part 50 can be formed with a refractive index according to a doping concentration and depth of impurities distributed in the interlayer insulating layer 30. Accordingly, the light incident into the optical refractive part 50 may be converged, diverged and aligned, and focused on the photodiode 20.

Figure 5:
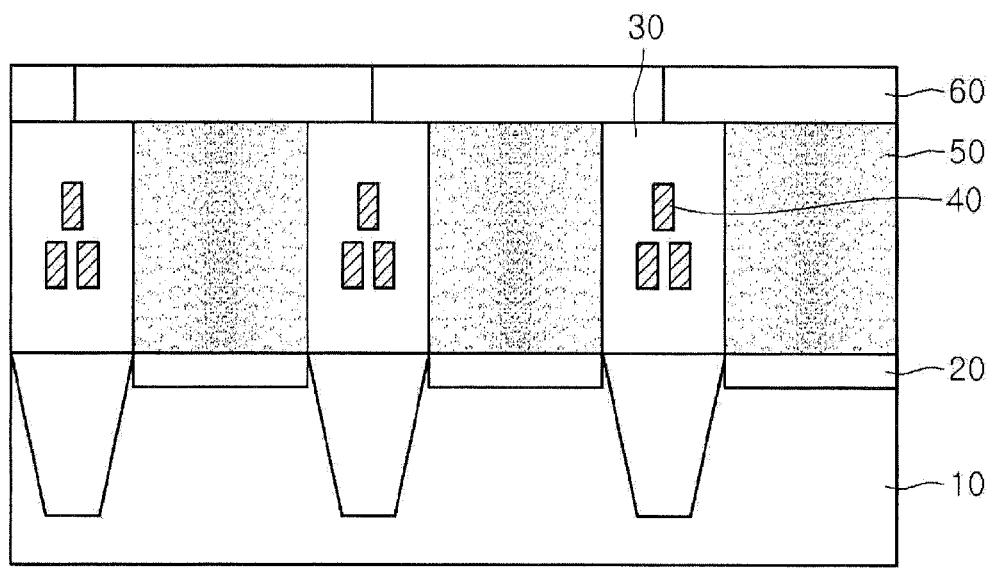
Figure 6:
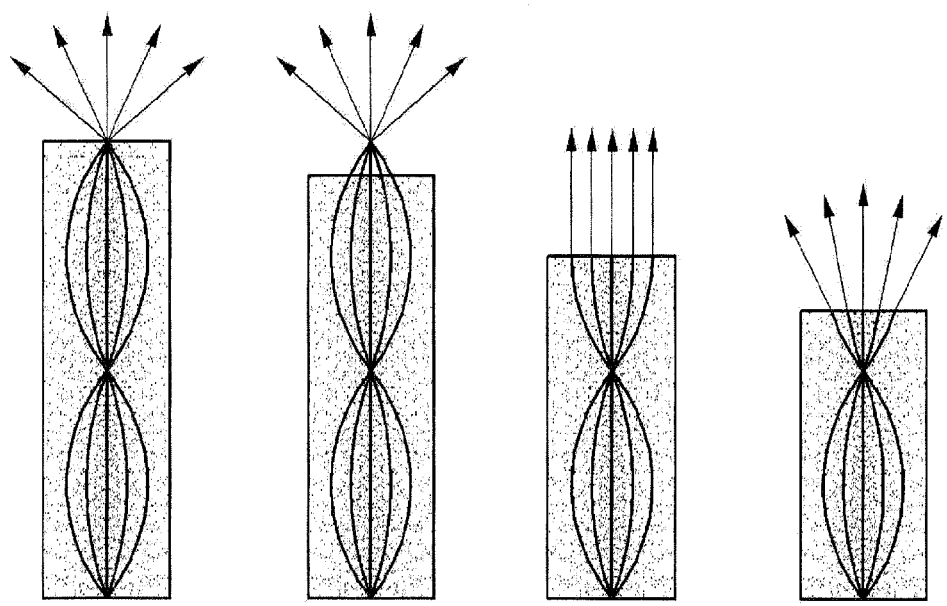
FIGS. 6A-6D illustrate performances according to length of a lens having a graded index in accordance with embodiments of the present invention.

In a further embodiment, referring to FIG. 5, a color filter 60 can be provided on the interlayer insulating layer 30 including the optical refractive part 50. The color filter 60 can be formed on each unit pixel region to separate colors from incident light. For example, the color filter 60 can include red (R), green (G), and blue (B) color filters, formed in respective unit pixel regions.

The image sensor according to an embodiment can enhance the photosensitivity by using the optical refractive part of the interlayer insulating layer as a lens.

In addition, according to embodiments, the optical refractive part is formed within the interlayer insulating layer, so that integration of devices can be achieved.

A method for manufacturing an image sensor according to an embodiment will now be described with reference to FIGS. 1 through 5.

Referring to FIG. 1, a photodiode 20 can be formed for each unit pixel on a semiconductor substrate 10.

The semiconductor substrate 10 can include a device isolation layer defining an active region and a field region. In the active region, the photodiode 20 receiving light to generate photons and a CMOS circuit (not shown) connected to the photodiode 20 to convert the received photons to an electrical signal can be formed in each unit pixel.

An interlayer insulating layer 30 including metal lines 40 can be formed on the semiconductor substrate 10 on which the photodiode 20 is formed.

The interlayer insulating layer 30 can be formed of at least two layers. For example, the interlayer insulating layer 30 can be formed of a nitride layer and an oxide layer.

The metal lines 40 can be formed in plurality to penetrate the interlayer insulating layer 30 and provide signal and power lines to devices formed on the substrate 10.

In further embodiments, the interlayer insulating layer 30 can include a passivation layer. The passivation layer is to protect a device from moisture, scratch or the like, and may be formed of insulating material. For example, the passivation layer can be formed of any one of the following: a silicon oxide layer, a silicon nitride layer, and a silicon oxynitride layer. In certain embodiments, the passivation layer can have a stack structure including at least two of the above described layers. Of course, the forming of the passivation layer can be omitted.

Figure 2:
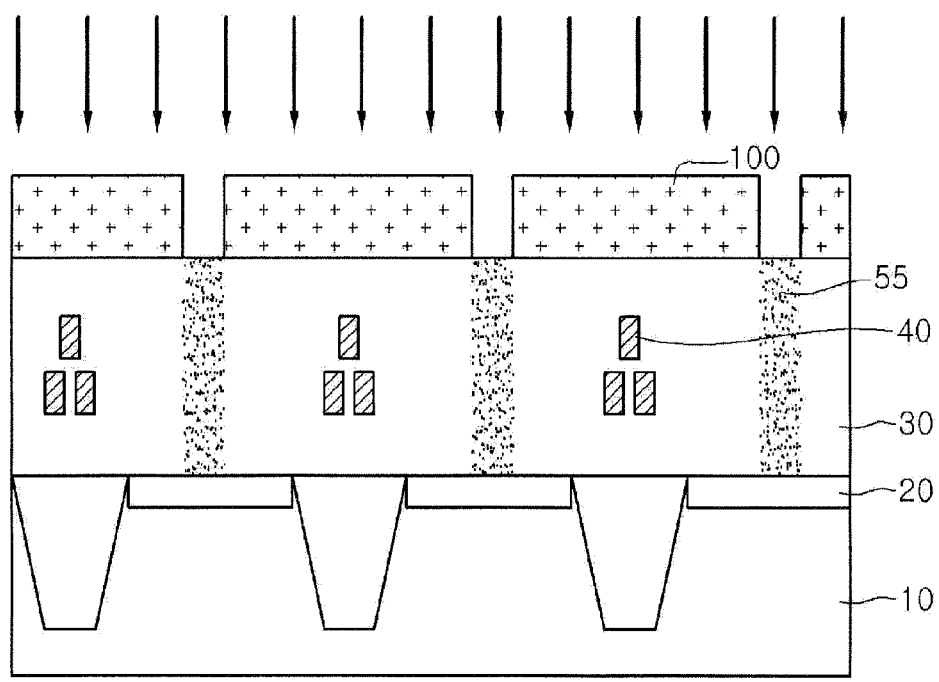

Referring to FIG. 2, a photoresist pattern 100 can be formed on the interlayer insulating layer 30. The photoresist pattern 100 can be formed by coating a photoresist film on the interlayer insulating layer 30 and exposing and developing the coated photoresist film.

The photoresist pattern 100 can be formed such that it exposes a surface of the interlayer insulating layer 30 corresponding to a region of the photodiode 20 and blocks a surface of the interlayer insulating layer 30 corresponding to regions having the metal lines 40. In particular, an opening of the photoresist pattern 100 can be formed so as to have a width less than a width of the photodiode 20.

Ions of a material having a high refractive index can be implanted into the interlayer insulating layer 30 by using the photoresist pattern 100 as an ion implantation mask. Accordingly, an ion-implanted portion 55 is formed in the interlayer insulating layer 30. The ion-implanted portion 55 has a higher refractive index than the interlayer insulating layer 30. In one embodiment, the interlayer insulating layer 30 can have a refractive index ranging from about 1.4 to 1.5, and the ion-implanted portion 55 can have a refractive index ranging from about 1.5 to 1.7. Also, the ion-implanted portion 55 can be a central region of the photodiode 20 corresponding to a unit pixel.

For example, the ions implanted into the interlayer insulating layer 30 can be silver ions or lithium ions.

Also, in the case of implanting impurities into the interlayer insulating layer 30, doping concentration and depth can be at least twice continuously controlled to dope impurities along a light path from a light incident surface to the photodiode 20. By doing so, the region into which the impurities are implanted can be forced to have a graded index by the doping concentration and depth.

The graded index means that the refractive index of an optical medium varies with position. The graded index can be made by doping a material having a high refractive index into a medium such that a desired refractive index is obtained.

For example, as shown in FIGS. 6A-6D, in the case of a lens having a graded index, its performance may vary with its length. That is, as shown in FIGS. 6A, 6B, 6C and 6D, light arriving on a surface of the lens can be converged, diverged or aligned according to doping concentration and length of the lens. For example, in FIG. 6A light is guided, in FIG. 6B light is focused, in FIG. 6C light is collimated, and in FIG. 6D light is diverged. That is, by applying the lens having the graded index to the present embodiment, it is possible not to deviate from the light path to the photodiode but to converge the light arriving on a pixel surface.

Figure 3:
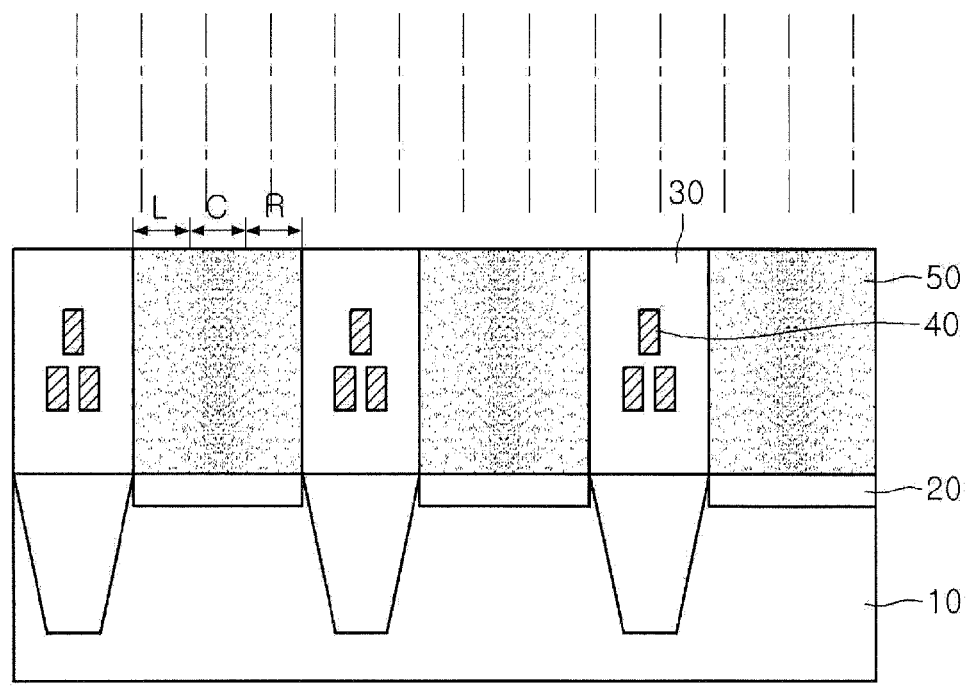

Referring to FIG. 3, the photoresist pattern 100 (if used) is removed, and an optical refractive part 50 is in a region of the interlayer insulating layer 30 corresponding to the photodiode 20. The optical refractive part 50 can be formed by performing a thermal process with respect to the ion-implanted portion 55. When a thermal process for the ion-implanted portion 55 is performed, the impurities of the ion-implanted portion 55 may be diffused toward left and right sides about a central region C to form the optical refractive part 50. In particular, the central region C of the optical refractive part 50 may be formed at the highest doping concentration, and the left region L and the right region R may be formed at a doping concentration lower than that of the central portion C. For example, the central region C of the optical refractive part 50 can have a refractive index ranged from about 1.6 to 1.7, and the left region L and the right region R can have a refractive index ranging from about 1.5 to 1.6.

Accordingly, the optical refractive part 50 is formed in the interlayer insulating layer 30 on the photodiode 20 to focus light on the photodiode 20 like a microlens.

That is, since the optical refractive part 50 has a graded index where the refractive index increases as it goes to the central region C, light can be focused through the optical refractive part 50. Also, since the optical refractive part 50 has a higher refractive index than the interlayer insulating layer 30, the optical refractive part 50 can act as a lens.

Figure 4:
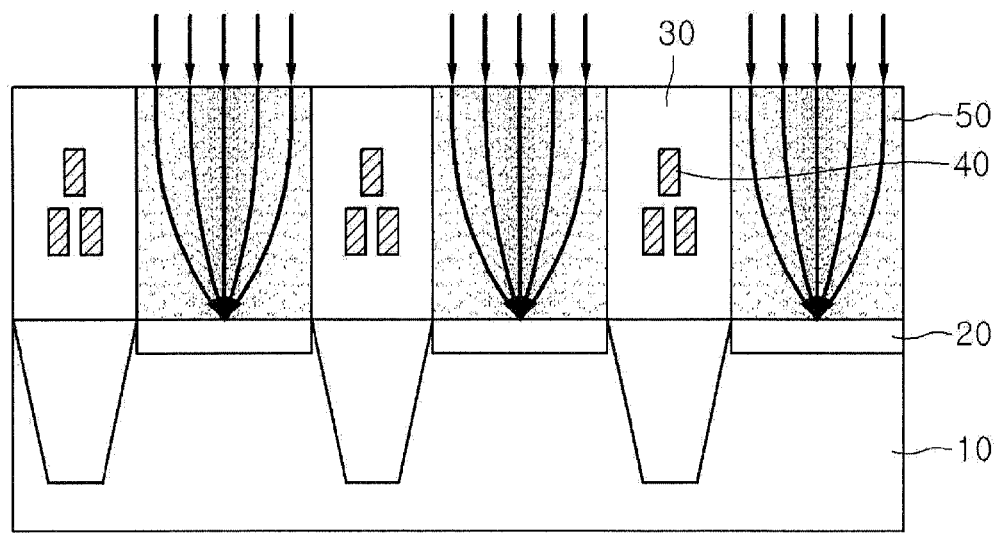

Referring to FIG. 4, when light is incident into the optical refractive part 50 having the graded index, the light is finally focused on the photodiode 20. That is, by allowing the impurities in the optical refractive part 50 to have the graded index about the horizontal direction along the light path of the optical refractive part 50, light is diffused and focused and, accordingly, it is possible to focus the light on the photodiode 20.

Referring to FIG. 5, a color filter 60 can be formed on the interlayer insulating layer 30 including the optical refractive part 50. In one embodiment, the color filter 60 is formed on the interlayer insulating layer 30 by spin-coating a color filter material containing a photosensitive material and a pigment or a photosensitive material and a dye. The coated color filter material is exposed to light by using a pattern mask and then developed to form a color filter.

The color filter 60 can be formed in each pixel to separate colors from incident light. For example, the color filter 60 can include red (R), green (G), and blue (B) color filters, which are formed in unit pixel regions, respectively.

According to embodiments, the method for manufacturing an image sensor can enhance the light focusing rate by forming an optical refractive part inside the interlayer insulating layer on the photodiode.

Also, since the optical refractive part is formed on the photodiode, crosstalk can be inhibited to enhance the sensitivity.

Furthermore, since the optical refractive part can act as a microlens formed inside the interlayer insulating layer, integration of devices can be enhanced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate including a photodiode for each unit pixel;
   an interlayer insulating layer including metal lines on the semiconductor substrate; and
   an optical refractive part in a region of the interlayer insulating layer corresponding to the photodiode for focusing light on the photodiode, wherein the optical refractive part comprises impurities having a graded index along a light path to the photodiode.

2. The image sensor according to claim 1, wherein the optical refractive part has a higher refractive index than the interlayer insulating layer.

3. The image sensor according to claim 1, wherein the optical refractive part comprises silver ions.

4. The image sensor according to claim 1, wherein the optical refractive part comprises lithium ions.

5. The image sensor according to claim 1, wherein the interlayer insulating layer has a refractive index ranging from 1.4 to 1.5 and the optical refractive part has a refractive index ranging from 1.6 to 1.7.

6. The image sensor according to claim 1, further comprising a color filter on the interlayer insulating layer including the optical refractive part.

7. The image sensor according to claim 1, wherein the optical refractive part extends through the entire thickness of the interlayer insulating layer.

8. The image sensor according to claim 1, wherein the optical refractive part contacts the photodiode.

9. A method for manufacturing an image sensor according to claim 1, the method comprising:
   forming a photodiode for each unit pixel on a semiconductor substrate;
   forming an interlayer insulating layer on the semiconductor substrate; and
   forming an optical refractive part in a region of the interlayer insulating layer corresponding to the photodiode in order to focus light on the photodiode, wherein the optical refractive part comprises impurities having a graded index along a light path to the photodiode.

10. The method according to claim 9, wherein the forming of the optical refractive part comprises:
    forming a photoresist pattern on the interlayer insulating layer exposing a region of the interlayer insulating layer corresponding to the photodiode; and
    implanting impurities into the interlayer insulating layer using the photoresist pattern as a mask.

11. The method according to claim 10, wherein implanting the impurities comprises controlling doping concentration and depth of the impurities at least once to provide the graded index along the light path to the photodiode.

12. The method according to claim 9, wherein forming the optical refractive part comprises implanting silver ions into the interlayer insulating layer.

13. The method according to claim 9, wherein forming the optical refractive part comprises implanting lithium ions into the interlayer insulating layer.

14. The method according to claim 9, wherein the forming of the optical refractive part comprises implanting impurities into the interlayer insulting layer and controlling doping concentration and depth of the impurities at least once.

15. The method according to claim 9, further comprising forming a color filter on the interlayer insulating layer including the optical refractive part.

16. The method according to claim 9, wherein the interlayer insulating layer has a refractive index ranging from about 1.4 to 1.5 and the optical refractive part has a refractive index ranging from about 1.5 to 1.7.

17. The method according to claim 16, wherein the optical refractive part has a refractive index in a central region ranging from about 1.6 to 1.7 and a refractive index in an outer region ranging from about 1.5 to 1.6.

* * * * *